(12) United States Patent
Stoneham et al.

(10) Patent No.: US 7,411,279 B2
(45) Date of Patent: Aug. 12, 2008

(54) COMPONENT INTERCONNECT WITH SUBSTRATE SHIELDING

(75) Inventors: Edward B. Stoneham, Los Altos, CA (US); Thomas M. Gaudette, Boston, MA (US)

(73) Assignee: Endwave Corporation, San Jose, CA (US)

( * ) Notice: Subject to any disclaimer, the term of this patent is extended or adjusted under 35 U.S.C. 154(b) by 0 days.

(21) Appl. No.: 10/882,378

(22) Filed: Jun. 30, 2004

(65) Prior Publication Data

US 2006/0001129 A1    Jan. 5, 2006

(51) Int. Cl.
*H01L 39/02* (2006.01)

(52) U.S. Cl. .................. 257/662; 257/663; 257/664; 257/E23.114; 257/531; 333/247

(58) Field of Classification Search ......... 257/662–664, 257/668, 531
See application file for complete search history.

(56) References Cited

U.S. PATENT DOCUMENTS

| | | | |
|---|---|---|---|
| 3,370,256 A | 2/1968 | Baur et al. | 333/156 |
| 3,613,230 A | 10/1971 | Griff | 29/828 |
| 4,394,633 A | 7/1983 | Klein | 333/238 |
| 4,460,880 A | 7/1984 | Turner | 333/238 |
| 4,673,904 A * | 6/1987 | Landis | 333/238 |
| 4,776,087 A | 10/1988 | Cronin et al. | 29/828 |
| 4,801,905 A | 1/1989 | Becker | 333/238 |
| 4,845,311 A | 7/1989 | Schreiber et al. | 174/36 |
| 5,294,751 A | 3/1994 | Kamada | 174/52.4 |
| 5,317,292 A | 5/1994 | Leeb | 333/238 |
| 5,426,399 A | 6/1995 | Matsubayashi et al. | 333/1 |
| 5,453,154 A | 9/1995 | Thomas et al. | 216/18 |
| 5,461,353 A | 10/1995 | Eberhardt | 333/246 |
| 5,532,658 A | 7/1996 | Tonegawa et al. | 333/246 |
| 5,574,415 A | 11/1996 | Peterson | 333/238 |
| 5,581,217 A | 12/1996 | Macdonald | 333/246 |
| 5,796,165 A | 8/1998 | Yoshikawa et al. | |
| 5,828,555 A | 10/1998 | Itoh | 361/784 |
| 5,830,797 A | 11/1998 | Cleeves | 438/296 |
| 5,854,867 A | 12/1998 | Lee et al. | |
| 5,880,657 A | 3/1999 | Dorschky et al. | 333/246 |
| 6,000,120 A * | 12/1999 | Arledge et al. | 29/600 |

(Continued)

FOREIGN PATENT DOCUMENTS

DE          155025        11/1902

(Continued)

*Primary Examiner*—Howard Weiss
*Assistant Examiner*—John C Ingham
(74) *Attorney, Agent, or Firm*—Kolish Hartwell PC

(57) ABSTRACT

An example of a circuit structure may include a first dielectric layer having first and second surfaces, and a channel extending at least partially between the first and second surfaces and along a length of the first dielectric layer. First and second conductive layers may be disposed on respective portions of the first and second surfaces. A first conductor, having an end, may be disposed on a surface of the first dielectric layer, including at least a first portion extending around at least a portion of the conductor end. The second conductive layer may line the channel extending around a portion of the conductor end. Some examples may include a stripline having a second conductor connected to the first conductor. Some examples may include a cover having a wall positioned on the first dielectric over the second conductor.

21 Claims, 3 Drawing Sheets

U.S. PATENT DOCUMENTS

| | | | |
|---|---|---|---|
| 6,239,669 B1 * | 5/2001 | Koriyama et al. | 333/26 |
| 6,268,283 B1 | 7/2001 | Huang | 438/638 |
| 6,268,637 B1 | 7/2001 | Gardner et al. | 257/522 |
| 6,274,920 B1 | 8/2001 | Park et al. | 257/531 |
| 6,356,173 B1 * | 3/2002 | Nagata et al. | 333/247 |
| 6,417,744 B1 | 7/2002 | Albinsson et al. | 333/33 |
| 6,483,406 B1 * | 11/2002 | Sawa et al. | 333/247 |
| 6,486,755 B2 | 11/2002 | Aruga | 333/246 |
| 6,495,903 B2 | 12/2002 | Xu et al. | 257/531 |
| 6,515,222 B2 | 2/2003 | Underwood et al. | 174/35 |
| 6,617,686 B2 * | 9/2003 | Davies | 257/725 |
| 6,646,526 B2 | 11/2003 | Kinayman et al. | 333/248 |
| 6,653,915 B1 | 11/2003 | Arledge et al. | 333/238 |
| 6,731,009 B1 | 5/2004 | Jones et al. | |
| 6,787,893 B2 | 9/2004 | Nakajima et al. | |
| 2002/0056888 A1 | 5/2002 | Depetro | 257/528 |
| 2003/0001252 A1 | 1/2003 | Ku et al. | |
| 2003/0015772 A1 * | 1/2003 | Ivanov et al. | 257/659 |
| 2003/0064547 A1 | 4/2003 | Akram et al. | |
| 2003/0071325 A1 | 4/2003 | Xu et al. | 257/531 |
| 2003/0132821 A1 | 7/2003 | Otsuka et al. | 333/239 |
| 2003/0224553 A1 | 12/2003 | Manansala | |
| 2004/0155723 A1 * | 8/2004 | Koriyama | 333/26 |

FOREIGN PATENT DOCUMENTS

| | | |
|---|---|---|
| GB | 1 243 764 | 8/1971 |
| JP | 63-129632 | 6/1988 |
| JP | 1146426 | 6/1989 |
| JP | 3041803 | 2/1991 |
| JP | 3211870 | 9/1991 |
| JP | 4-139783 | 5/1992 |
| JP | 4294602 | 10/1992 |
| WO | WO92/22939 | 12/1992 |

* cited by examiner

COMPONENT INTERCONNECT WITH SUBSTRATE SHIELDING

BACKGROUND

Interconnects between transmission lines, and between a transmission line and a circuit structure, such as a lumped element or a substrate component, may produce interference and/or be subject to interference from other circuits. Shielding may reduce interference between communication signals carried on different transmission lines and other circuit structures. A coaxial cable is a transmission line in which an outer conductor that surrounds an inner conductor provides shielding. Such coaxial cables require separate mechanical interconnects that match the cable configuration. Various other forms of transmission lines have been developed that are formed on or in circuit boards. These include microstrip and other strip lines, slot lines, coplanar waveguides, and the like. These transmissions lines, as well as other circuit components are generally not shielded, with the result that evanescent electromagnetic fields may be produced that can interfere with the operation of other circuit components.

BRIEF SUMMARY OF THE DISCLOSURE

A circuit structure may include a first dielectric layer having first and second surfaces, and a channel extending at least partially between the first and second surfaces and along a length of the first dielectric layer. First and second conductive layers may be disposed on at least respective portions of the first and second surfaces. A first conductor, having an end, may be disposed on a surface of the first dielectric layer, including at least a first portion extending around at least a portion of the conductor end. The second conductive layer may line the channel extending around at least a portion of the conductor end. Some examples may include a stripline having a second conductor connected to the first conductor, or a cover having a wall positioned on the first dielectric over the second conductor.

DETAILED DESCRIPTION OF VARIOUS EMBODIMENTS

Figure 1:
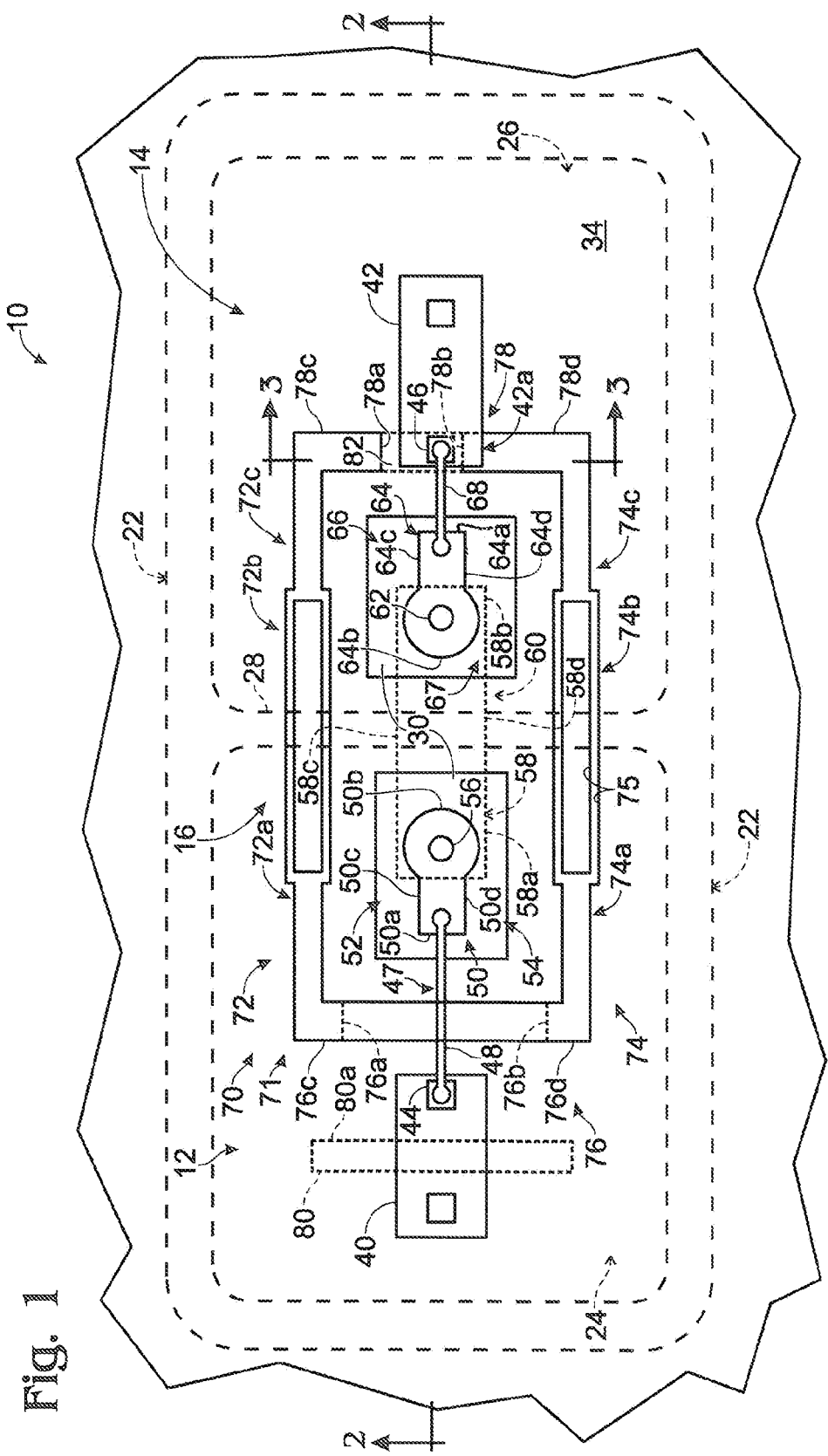
FIG. 1 is a top view of an interconnect circuit structure with shielding.
Figure 2:
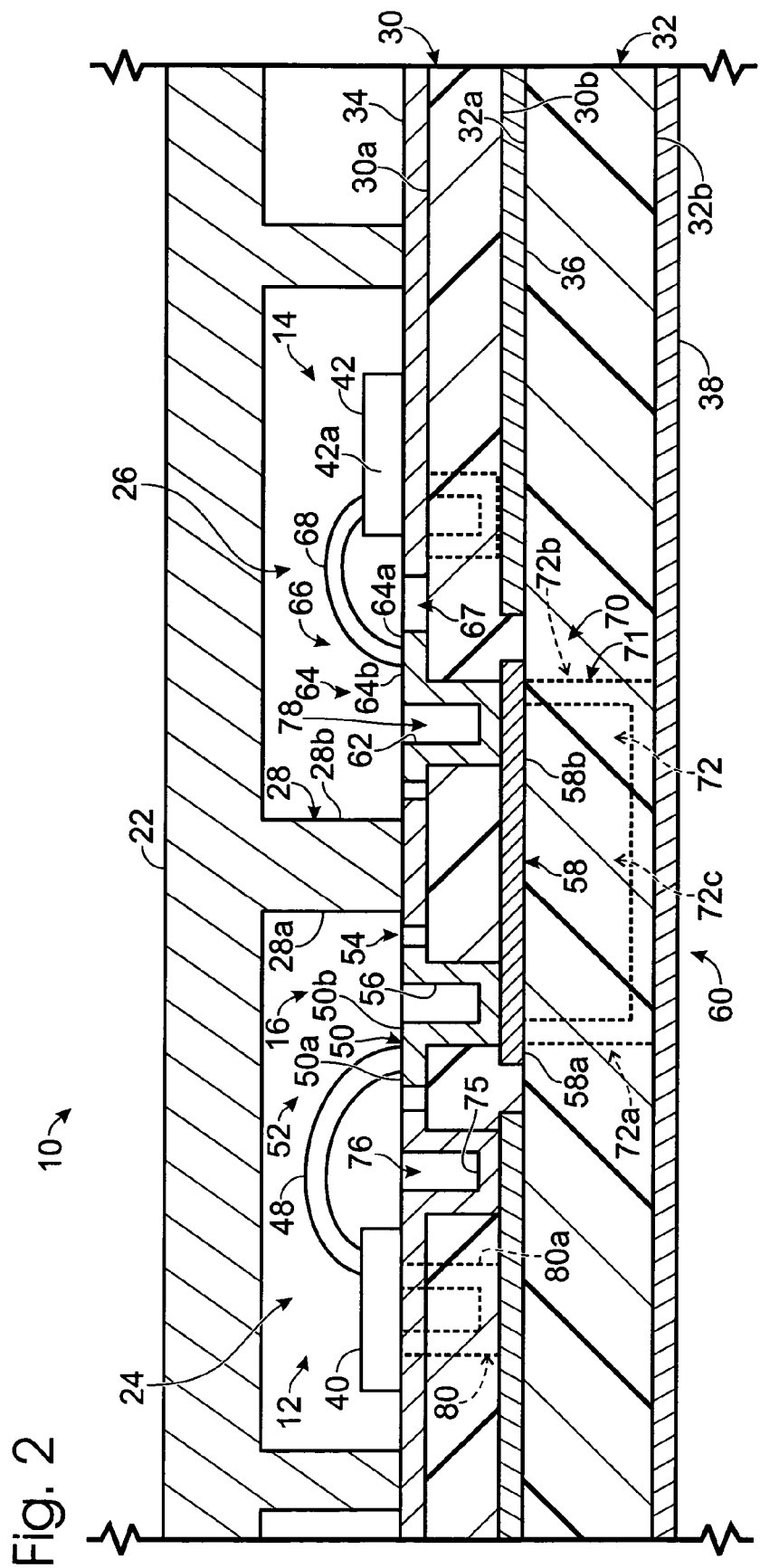
FIG. 2 is a cross section taken along line 2-2 of FIG. 1.
Figure 3:
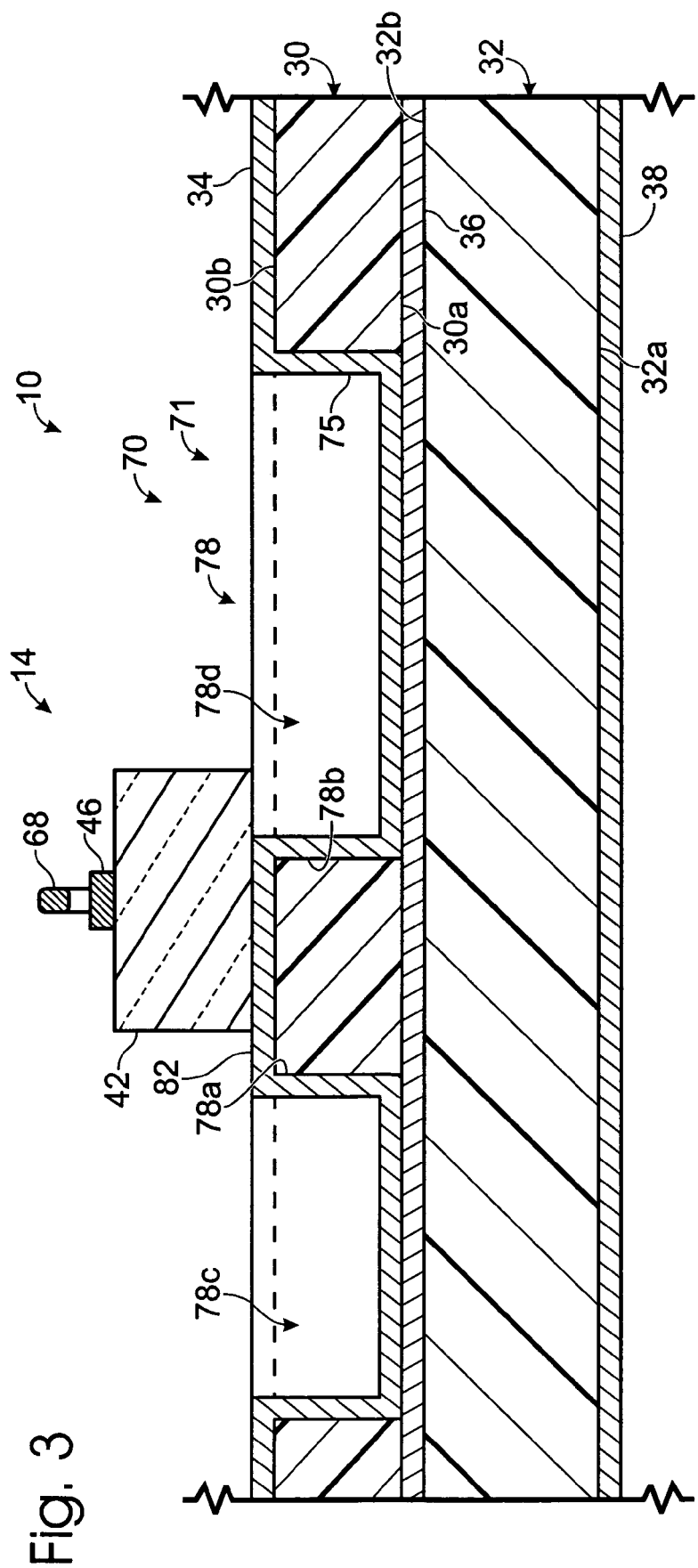
FIG. 3 is a cross section taken along line 3-3 of FIG. 1.

FIGS. 1-3 depict a simplified exemplary circuit structure 10 having various features illustrated in a single composite embodiment for convenience. These features may have various forms, and may be realized in other circuit structures individually or in various other combinations. As used herein, a circuit structure and a circuit assembly may individually or in combination form one or more complete circuits, one or more portions of one or more circuits, one or more combinations of elements or components of a circuit, or any combination of circuits, circuit portions, and circuit components, and may include shared circuit portions or components.

In this example, then, circuit structure 10 may include one or more of a first circuit assembly 12, a second circuit assembly 14, and a connecting circuit assembly 16. Circuit assembly 16 may be connected to one or both of circuit assemblies 12 and 14, and further may interconnect circuit assemblies 12 and 14, such as is shown.

Circuit structure 10 may also include a cover 22 that may cover one or both of circuit assemblies 12 and 14. The cover may be made of any appropriate material. For example, the cover may be made of an electromagnetically (including electrically or magnetically) conductive material, such as aluminum, copper or other metal, and may be formed of a single homogeneous material, or a combination of materials, at least one of which is conductive, such as a conductive layer with a non-conductive or semi-conductive material. Cover 22 may provide one or more chambers that may protect enclosed circuit assemblies from environmental and electromagnetic influences and/or isolate the enclosed circuit assemblies. For example, cover 22 may form a first chamber 24 covering circuit assembly 12, and a second chamber 26 covering circuit assembly 14. In this example, a common wall 28 may separate chambers 24 and 26. Wall 28 may have opposite faces or sides 28a and 28b, and may extend along circuit assembly 16.

Generally, circuit structure 10 may further include first and second dielectric layers 30 and 32, having respective first and second surfaces 30a, 30b and 32a, 32b. A top metal layer 34 is in contact with dielectric surface 30a, an intermediate metal layer 36 extends between dielectric surfaces 30b and 32a, and a base metal layer 38 extends along surface 32b. These various layers are not shown to scale, and may have thicknesses different than those shown. For instance, base metal layer 38 may be a conductive substrate used in packaging, as a carrier of circuits, or as part of a housing that includes cover 22.

As mentioned, circuit assemblies 12, 14 and 16 may include various components. For purposes of illustration, circuit assemblies 12 and 14 may include respective circuit elements 40 and 42. These circuit elements may for instance include a lumped element or combination or network of passive and/or active elements, such as transmission lines, resistors, capacitors, inductors, and semiconductor devices, and may be mounted on a circuit chip having a dielectric, semiconductive or conductive substrate. In one example, the circuit assemblies may include one or a combination of diodes and transistors in an integrated circuit (IC) or chip, including, for example, a monolithic microwave integrated circuit (MMIC), application specific integrated circuit (ASIC), or the like. Circuit elements 40 and 42 may have a conductive pad, conductor or terminal, such as respective terminals 44 and 46, each of which accommodates connection to another circuit element.

Interconnect circuit assembly 16 may interconnect circuit assemblies 12 and 14. This may include an interconnection 47, such as a bond wire 48 interconnecting terminal 44 with a signal conductor 50 of a microstrip line 52. Conductor 50 may include first and second ends 50a and 50b, and opposite sides 50c and 50d. Intermediate metal layer 36 may serve as a signal return conductor, also referred to as a reference potential or ground conductor or plane, for the microstrip line. Conductor 50 may be positioned on dielectric layer 30 in an opening 54 in top metal layer 34.

End 50b of conductor 50 may be connected to a via 56 extending through dielectric layer 30 to a center conductor 58 of a stripline 60. Metal layers 34 and 38 may function as ground planes for the stripline. Conductor 58, having ends 58a and 58b, and sides 58c and 58d, also may extend under wall 28 to a second via 62. Via 62 may extend from conductor 58 to a second signal conductor 64 of a second microstrip line 66. Similar to conductor 50, conductor 64 may be positioned on dielectric layer 30 in an opening 67 in top metal layer 34. Conductor 64 also may include first and second ends 64a and 64b, and opposite sides 64c and 64d. Again, metal layer 36 may function as a ground plane for microstrip line 66. End

64a of the signal conductor may be connected to terminal 46 of circuit element 42, by another interconnection 47 in the form of a bond wire 68.

This simplistic illustration shows a transition in the form of interconnection assembly 16, coupling circuit element 40 and circuit element 42 using bond wire connections to microstrip lines, and vias interconnecting microstrip lines and an interconnecting stripline. The microstrip lines conduct signals on the surface of dielectric layer 30, whereas the stripline conducts signals under dielectric layer 30, or within dielectric layers 30 and 32. Top metal layer 34 extends over the stripline, providing a layer for supporting wall 28 of cover 22, which layer also provides continuity of ground between the cover and the top metal layer. By using this interconnect circuit structure, chambers 24 and 26 enclose circuit assemblies 12 and 14, effectively shielding them from electromagnetic interference from each other and from other external circuits.

A series 70 of channels 71 may provide further shielding between circuit structures. For example, channels 71 may include side trenches 72 and 74 that extend along the sides of microstrip lines 52 and 66, and stripline 60. In particular, trench portions 72a, 74a may extend along respective sides 50c, 50d of signal conductor 50, portions 72b, 74b may extend along respective sides 58c, 58d of stripline center conductor 58, and portions 72c, 74c may extend along respective sides 64c, 64d of signal conductor 64. Trenches 72 and 74 may extend through upper dielectric layer 30 between top and intermediate metal layers 34 and 36. Trench portions 72b and 74b also may further extend through lower dielectric layer 32, to bottom metal layer 38, as particularly shown in FIG. 2. As shown in the figures, trenches 72 and 74 have a layer of metal or lining 75 in them that, depending on the trench portion, may contact the top, intermediate and bottom metal layers, depending on the depth of the trench.

Trench series 70 of channels 71 may also include end trenches 76 and 78 extending along the ends 50a and 64a of microstrip conductors 50 and 64, respectively. Trenches 76 and 78 may extend partially or completely across the ends of the microstrip lines. For example, trench 76 is shown extending continuously along conductor end 50a. Optionally, trench 76 may extend only along a portion adjacent to trenches 72 and 74, as represented by trench ends 76a and 76b, shown in dashed lines, defining short trench portions 76c and 76d. Additionally or alternatively, a trench 80, as shown in dashed lines in FIGS. 1 and 2, may extend in at least dielectric layer 30 under circuit element 40, with a side 80a facing microstrip line 52.

End trench 78, illustrated in cross section in FIG. 3, may include ends 78a and 78b defining trench portions 78c and 78d. In the example shown, circuit element 42 has an end 42a extending over trench 78. In particular, trench end 78a is spaced from circuit element 42 and trench end 78b is positioned below the circuit element. A land or neck 82, formed by dielectric layer 30 and top metal layer 34, may extend between trench ends 78a, 78b. Circuit element 42 may be supported on neck 82 during mounting, allowing a portion of the circuit element to extend over trench portion 78d. Circuit element 42 may extend adjacent to the trench, may extend partially over the trench, or may extend to the opposite side of the trench, as shown in dashed lines.

End trenches 76 and 78 may be lined with metal lining 75, shown as though it is continuous with top metal layer 34. Depending on the depth of the trenches and the extent of placement of the lining, the lining may or may not contact more than one metal layer. In the examples shown, the trenches extend entirely through at least upper dielectric layer 30, with lining 75 contacting metal layers 34 and 36. Trench side portions 72b and 74b also extend through lower dielectric layer 32, with the lining further contacting bottom metal layer 38. The trenches may also extend only partially through one or both dielectric layers, in which case there may be contact with fewer metal layers. The trenches may extend partially or completely through each dielectric layer.

The trenches with metal lining 75 form a vertical shield for evanescent electromagnetic fields in the dielectric, which fields may be generated by circuit structures on one or both sides of the trench. The longer and deeper the trenches are, the more complete is the shielding that they provide, and the greater the isolation they provide. For example, optional shortened trench portions 76a and 76b provide limited shielding, continuous trench 76 provides greater shielding, and trench 78 having an intermediate extent along the end of conductor 64 of microstrip line 66, provides an intermediate amount of shielding.

Optionally, one or more of the trenches described may have lengths longer or shorter than those shown, be formed of separate trench portions, extend at angles, or extend along curved or irregular lines. Further, the metal layer lining the trenches may cover all or a portion of the trench surfaces.

Accordingly, while embodiments of circuit structures have been particularly shown and described with reference to the foregoing disclosure, many variations may be made therein. Other combinations and sub-combinations of features, functions, elements and/or properties may be used. Such variations, whether they are directed to different combinations or directed to the same combinations, whether different, broader, narrower or equal in scope, are also regarded as included within the subject matter of the present disclosure. The foregoing embodiments are illustrative, and no single feature or element is essential to all possible combinations that may be claimed in this or later applications. The claims, accordingly, define inventions disclosed in the foregoing disclosure. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

The invention claimed is:

1. A circuit structure comprising:
   a first dielectric layer having first and second surfaces and an at least partially hollow elongate channel having opposite walls extending at least partially between the first and second surfaces;
   a first conductive layer disposed on at least a portion of the first surface;
   a first conductor disposed on the second surface of the first dielectric layer and having opposite conductor sides and a conductor end facing the substrate component and extending between the conductor sides, the channel being spaced from the first conductor and including at least an elongate first channel portion and an elongate second channel portion, the first and second channel portions extending in alignment lengthwise and transverse to the conductor sides, spaced from and adjacent to the conductor end and proximate to the substrate component, the first channel portion having opposite first-channel-portion sides and a first channel-portion end extending between the first-channel-portion sides, and the second channel portion having opposite second-channel-portion sides and a second channel-portion end extending between the second-channel-portion sides and adjacent to and facing the first channel-portion end, the first and second channel-portion ends being spaced apart with a portion of the first dielectric layer extending between the first and second channel-portion ends;

a second conductive layer lining at least the walls of the first elongate channel portion, the second conductive layer being insufficient to fill the first and second elongate channel portions;

a first interconnect; and a substrate component mounted on the second surface spaced from the conductor end, and having a terminal, the first interconnect extending between the conductor end and the substrate component terminal; at least a first portion of the substrate component being mounted on the portion of the dielectric layer and being predominantly on one side of both of the first and second channel portions.

2. The circuit structure of claim 1, in which at least a portion of the channel extends through the dielectric layer, and the second conductive layer in the channel contacts the first conductive layer.

3. The circuit structure of claim 1, further comprising a second dielectric layer, a third conductive layer, a second conductor, and a second interconnect, the second dielectric layer having a first surface contacting the first conductive layer opposite the first dielectric layer, and a second surface, the third conductive layer being disposed on at least a portion of the second surface of the second dielectric layer, at least a portion of the channel extending through the first conductive layer and the second dielectric layer, the second conductor being spaced from the first conductive layer and disposed between the first surface of the first dielectric layer and the first surface of the second dielectric layer, and the second interconnect extending between the first and second conductors.

4. The circuit structure of claim 3, in which the channel also extends along the sides of the first and second conductors.

5. The circuit structure of claim 4, further comprising a conductive cover connected to the second conductive layer, mounted on the second surface of the first dielectric layer, and having walls connected to the second conductive layer and defining a chamber surrounding the substrate component, one of the walls of the chamber extending over the second conductor.

6. The circuit structure of claim 1, in which the channel extends only along the conductor end.

7. A circuit structure comprising:

a first dielectric layer having first and second surfaces and an at least partially hollow elongate channel having opposite walls extending at least partially between the first and second surfaces;

a first conductive layer disposed on at least a portion of the first surface;

a first elongate conductor disposed on the second surface of the first dielectric layer and having opposite sides and an end extending between the sides, the channel being spaced from the first conductor and including at least a first channel portion, the first channel portion extending transverse to the conductor sides, spaced from and adjacent to the conductor end, and having an end, the channel including a second channel portion extending along at least a portion of the conductor end, the second channel portion also having an end facing the end of the first channel portion, the ends of the first and second portions being spaced apart, with a portion of the first dielectric layer adjacent to the conductor end extending between the respective ends of the first and second portions of the channel;

a second conductive layer lining at least the walls of the first channel portion, the second conductive layer being insufficient to fill the first channel portion, and extending along the portion of the dielectric layer;

a first interconnect; and a substrate component mounted on the second surface spaced from the conductor end, and having a terminal, the first interconnect extending between the conductor end and the substrate component terminal; at least a first portion of the substrate component being mounted on the portion of the dielectric layer.

8. A circuit structure comprising:

a first dielectric layer having first and second surfaces and an at least partially hollow elongate channel having opposite walls extending at least partially between the first and second surfaces;

a first conductive layer disposed on at least a portion of the first surface;

a first elongate conductor disposed on the second surface of the first dielectric layer and having opposite sides and an end extending between the sides, the channel being spaced from the first conductor and including at least a first channel portion, the first channel portion extending transverse to the conductor sides, spaced from and adjacent to the conductor end, and having an end, the channel including a second channel portion extending along at least a portion of the conductor end, the second channel portion also having an end facing the end of the first channel portion, the ends of the first and second portions being spaced apart, with a portion of the first dielectric layer adjacent to the conductor end extending between the respective ends of the first and second portions of the channel;

a second conductive layer lining at least the walls of the first channel portion, the second conductive layer being insufficient to fill the first channel portion;

a first interconnect; and a substrate component mounted on the second surface spaced from the conductor end, and having a terminal, the first interconnect extending between the conductor end and the substrate component terminal; at least a first portion of the substrate component being mounted on the portion of the dielectric layer and a second portion of the substrate component extending over the channel.

9. A circuit structure comprising:

a first dielectric layer having first and second surfaces and an at least partially hollow elongate channel having opposite walls extending at least partially between the first and second surfaces;

a first conductive layer disposed on at least a portion of the first surface;

a first elongate conductor disposed on the second surface of the first dielectric layer and having opposite sides and an end extending between the sides, the channel being spaced from the first conductor and including at least a first channel portion extending transverse to the conductor sides, and spaced from, adjacent to, and extending continuously along the conductor end;

a second conductive layer lining at least the walls of the first channel portion, the second conductive layer being insufficient to fill the first channel portion;

a second dielectric layer;

a third conductive layer;

a second elongate conductor; and a second interconnect;
the second dielectric layer having a first surface contacting the first conductive layer opposite the first dielectric layer, and a second surface, the third conductive layer being disposed on at least a portion of the second surface of the second dielectric layer, the channel extending along the sides of the first and second conductors and extending only through the first dielectric layer along the first conductor, at least a portion of the channel extending through the first conductive layer and the second dielectric layer, the second conductor being spaced from the first conductive layer and disposed between the first surface of the first dielectric layer and the first surface of the second dielectric layer, and the second interconnect extending between the first and second conductors.

10. The circuit structure of claim 9, in which the channel extends through both the first and second dielectric layers along the sides of the second conductor.

11. A circuit structure comprising:
a first dielectric layer having first and second surfaces and an at least partially hollow elongate channel having opposite walls extending at least partially between the first and second surfaces;
a first conductive layer disposed on at least a portion of the first surface;
a first elongate conductor disposed on the second surface of the first dielectric layer and having opposite sides and an end extending between the sides, the channel being spaced from the first conductor and including at least a first channel portion, the first channel portion extending transverse to the conductor sides, spaced from and adjacent to the conductor end, and having an end, the channel including a second channel portion extending along at least a portion of the conductor end, the second channel portion also having an end facing the end of the first channel portion, the ends of the first and second portions being spaced apart, with a portion of the first dielectric layer adjacent to the conductor end extending between the respective ends of the first and second portions of the channel;
a second conductive layer lining at least the walls of the first channel portion, the second conductive layer being insufficient to fill the first channel portion;
a first interconnect; and
a substrate component mounted on the second surface spaced from the conductor end and extending directly over the channel, and having a terminal, the first interconnect extending between the conductor end and the substrate component terminal.

12. The circuit structure of claim 11, in which the substrate component straddles the channel.

13. A circuit structure comprising:
a first dielectric layer having first and second surfaces;
a first conductive layer disposed on at least a portion of the first surface of the first dielectric layer;
a first conductor disposed on the second surface of the first dielectric layer;
a second conductive layer disposed on at least a portion of the second surface of the first dielectric layer spaced from the first conductor;
a second dielectric layer having a first surface contacting the first conductive layer opposite the first dielectric layer, and a second surface;
a third conductive layer disposed on at least a portion of the second surface of the second dielectric layer;
a second conductor spaced from the first conductive layer and disposed between the first surface of the first dielectric layer and the first surface of the second dielectric layer;
a first interconnect extending between the first and second conductors; and
a conductive wall disposed directly over the second conductor, connected to the second conductive layer, and mounted on and extending upwardly away from the second surface of the first dielectric layer.

14. The circuit structure of claim 13, further comprising a substrate component mounted on the second conductive layer spaced from the first conductor and having a terminal; and a second interconnect extending between the first conductor and the substrate component terminal.

15. The circuit structure of claim 13, further comprising a conductive cover including the conductive wall, the conductive cover being supported on the second conductive layer and surrounding the first conductor.

16. The circuit structure of claim 13, in which the wall has a first side facing the first conductor, and a second side opposite the first side, the circuit structure further comprising a third conductor disposed on the second surface of the first dielectric layer on the second side of the wall, spaced from the second conductive layer, and a second interconnect connecting the second and third conductors.

17. The circuit structure of claim 16, further comprising a conductive cover including the conductive wall, the conductive cover being supported on the second conductive layer and including a first chamber surrounding the first conductor and a second chamber surrounding the third conductor.

18. The circuit structure of claim 17, further comprising a channel extending between the first and second surfaces of the first dielectric layer, the channel also extending in a continuous loop around the first and third conductors, the second conductive layer lining at least a portion of the channel.

19. The circuit structure of claim 18, in which at least a portion of the channel also extends through the second dielectric layer and the first conductive layer.

20. The circuit structure of claim 19, in which the second conductor has sides, and the channel extends through the first and second dielectric layers and the first conductive layer along the sides of the second conductor.

21. The circuit structure of claim 18, further comprising a substrate component and a third interconnect, the substrate component having a terminal, being mounted on the second surface of the first dielectric layer in the first chamber, on a side of the channel opposite from the first conductor, the third interconnect interconnecting the first conductor and the substrate component terminal.

* * * * *